(12) United States Patent
Xie

(10) Patent No.: US 9,462,691 B1
(45) Date of Patent: Oct. 4, 2016

(54) ENHANCED BALL GRID ARRAY

(71) Applicant: Altera Corporation, San Jose, CA (US)

(72) Inventor: Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 164 days.

(21) Appl. No.: 14/158,660

(22) Filed: Jan. 17, 2014

(51) Int. Cl.
*H05K 7/00* (2006.01)
*H05K 1/11* (2006.01)
*B23K 1/20* (2006.01)

(52) U.S. Cl.
CPC *H05K 1/111* (2013.01); *B23K 1/20* (2013.01)

(58) Field of Classification Search
CPC .............. H01L 2224/31; H01L 2924/00014; H01L 2224/1411; H01L 2224/14131; H01L 2224/16225; H01L 23/3128; H01L 23/50; H01L 24/17; H01L 2924/14; H01L 2924/15311; H01L 2924/19041
USPC ........ 361/749, 760, 774, 777; 174/254, 260, 174/261, 267
See application file for complete search history.

(56) References Cited

U.S. PATENT DOCUMENTS

| 5,798,567 | A | * | 8/1998 | Kelly | ....................... | H01L 23/13 257/723 |
| 6,018,462 | A | * | 1/2000 | Sakuyama | .............. | H01L 22/32 257/738 |
| 7,098,534 | B2 | * | 8/2006 | Lloyd | ..................... | H01L 23/62 257/723 |
| 2007/0262467 | A1 | * | 11/2007 | Birzer | ..................... | H01L 22/32 257/778 |

* cited by examiner

*Primary Examiner* — Yuriy Semenenko

(57) ABSTRACT

A two-dimensional array of bonding pads is formed on a first major surface of a substrate. At least some of the pads are connected to conductors that extend across or into the substrate. The pads can be classified in two groups. A first group is conventional, each pad providing a continuous electrically conductive surface on which a solder ball or solder bump may be formed. In the second group, each pad has a plurality of isolated electrically conductive regions that are connected to different conductors that extend across or into the substrate. Solder balls or solder bumps having a first height are mounted on some of the pads. Multi-terminal devices that have a height that is no more than that of the first height are mounted on at least some of the second group of pads; and their terminals are connected to different electrically conductive regions.

25 Claims, 4 Drawing Sheets

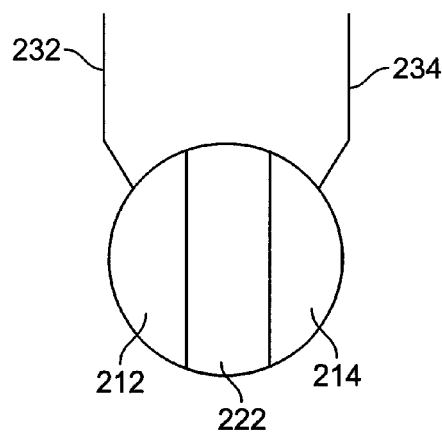
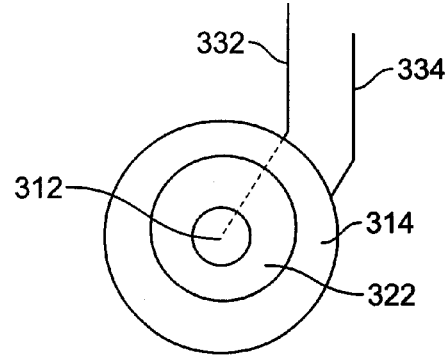
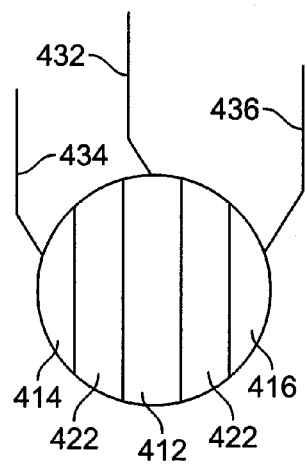
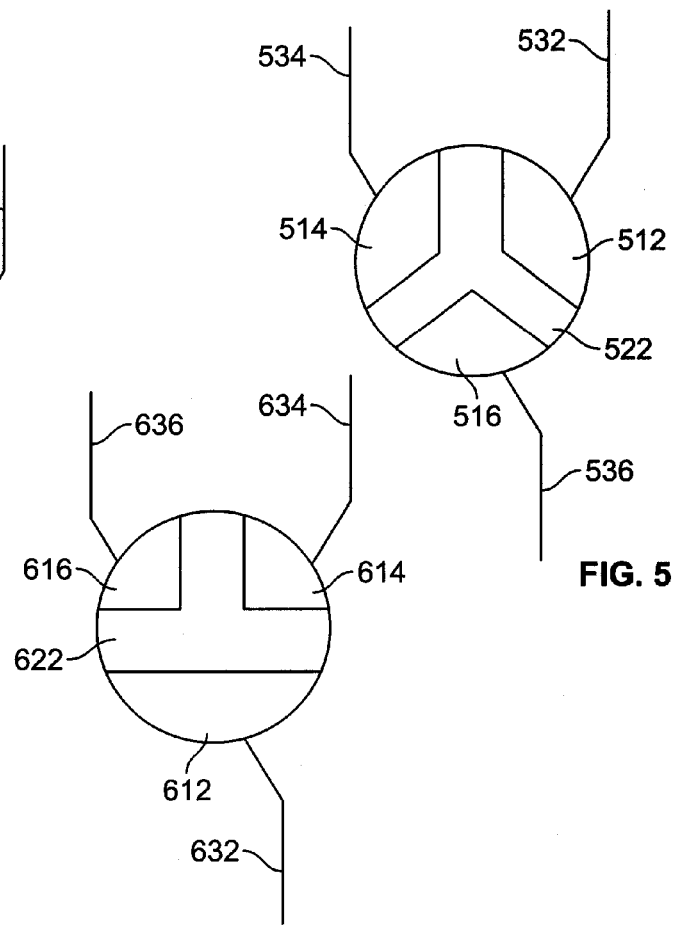
FIG. 2
FIG. 3
FIG. 4
FIG. 5
FIG. 6

ENHANCED BALL GRID ARRAY

BACKGROUND

A conventional ball grid array is a two-dimensional array of solder balls or solder bumps formed on a major surface of a substrate such as a semiconductor integrated circuit or a circuit board. Typically, the balls or bumps are mounted on pads on the surface of the substrate; and are in non-rectifying electrical and mechanical contact with the pads. The term "ball grid array" as used herein also includes the pads. For convenience, we will refer to whatever underlies the pads as a substrate. The substrate includes electrical conductors that may extend across the substrate and/or into the substrate to connect the pads to other pads or other circuitry in the substrate. In some cases such as where the substrate is a circuit board, the conductors may extend through the substrate to a second major surface of the substrate.

Solder balls or solder bumps range widely in size depending on the application and the size of the substrate. They have a pitch as measured between the centers of two adjacent solder balls or solder bumps that may be as tight as about 2× their diameter. By way of example, but not limitation, a typical solder ball diameter is about 500 microns.

The solder balls and solder bumps provide non-rectifying electrical interconnects between the substrate and external circuitry for input/output (I/O), power and ground connections. Typically, the external circuitry is mounted on a second substrate such as a wiring board; and the solder balls or solder bumps are in electrical and mechanical contact with the external circuitry on the second substrate. Despite the relatively large number of solder balls or solder bumps that are present in a 2-D array compared to many other interconnect technologies, there always seems to be a need for more input/output connects At the same time, the solder balls and solder bumps take up a lot of real estate on the surface of the substrate while performing essentially only one function: electrical connectivity.

SUMMARY

The present invention is an enhanced ball grid array.

In a preferred embodiment of the invention, a two-dimensional array of bonding pads is formed on a first major surface of a substrate. At least some of the pads are connected to conductors that extend across or into the substrate. The pads can be classified in two groups. A first group is conventional, each pad providing a continuous electrically conductive surface on which a solder ball or solder bump may be formed. In the second group, each pad has a plurality of isolated electrically conductive regions that are connected to different conductors that extend across or into the substrate. Solder balls or solder bumps having a first height are mounted on some of the pads. Multi-terminal devices that have a height that is no more than that of the first height are mounted on at least some of the second group of pads; and their terminals are connected to different electrically conductive regions of the second group.

The multi-terminal devices may include passive electrical components including two-terminal devices such as resistors, capacitors, and inductors; three terminal devices such as "T" type and "Π" attenuators, "T" type and "Δ" type combiners and splitters; and four-terminal devices such as couplers. Advantageously, such components are mounted on pads having a plurality of electrically isolated regions so that each terminal of the passive component is electrically connected to a different one of the plurality of isolated electrically conductive regions of the pad.

The multi-terminal devices may also include active devices such as switches, sensors, accelerometers, diodes, transistors, MEMS devices, mechanical components, and the like, all of which have multiple electrical leads each of which leads is electrically connected to a different one of the electrically isolated electrically conductive regions of the pad on which it is mounted.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which:

FIG. 2 is a top view of a first detail of the embodiment of FIGS. 1A and 1B together with schematics of certain devices that may be used with it;

FIG. 3 is a top view of an alternative detail of the embodiment of FIGS. 1A and 1B;

FIG. 4 is a top view of a second alternative detail of the embodiment of FIGS. 1A and 1B;

FIG. 5 is a top view of a third alternative detail of the embodiment of FIGS. 1A and 1B;

FIG. 6 is a top view of a fourth alternative detail of the embodiment of FIGS. 1A and 1B;

DETAILED DESCRIPTION

Figure 1A:
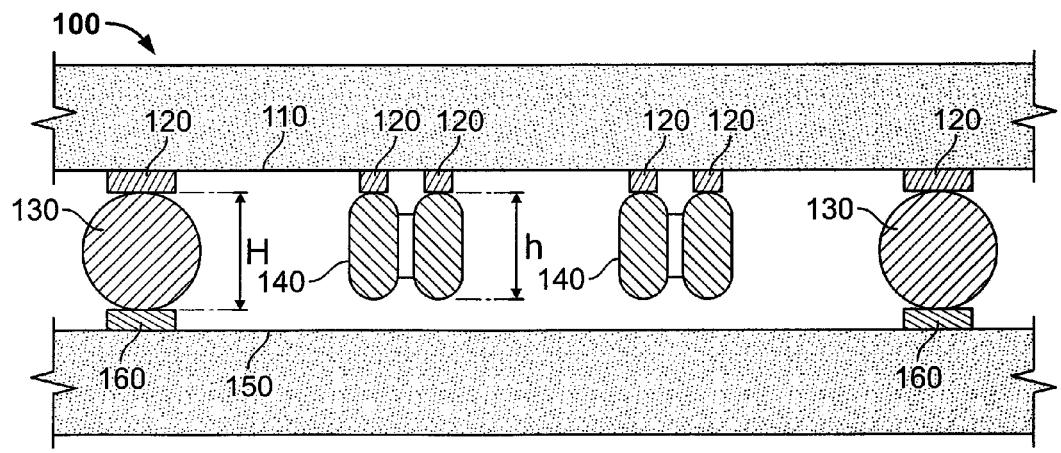
FIG. 1A is a cross-section of an illustrative embodiment of the invention.
Figure 1B:
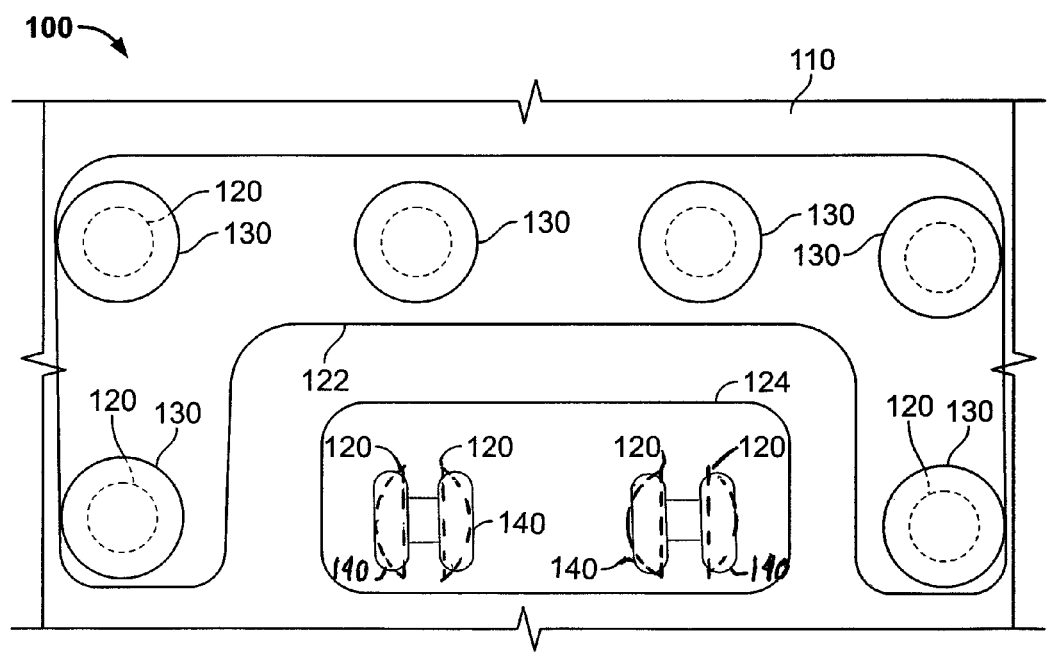
FIG. 1B is a view of a portion of an illustrative ball grid array of the invention.

FIG. 1A is a cross-section of an illustrative embodiment of a small portion of a ball grid array 100 of the present invention. FIG. 1B is a view of the array with one of the substrates removed. Ball grid array 100 comprises a first substrate 110, a plurality of bonding pads 120 formed on a surface of the substrate, the bonding pads being divisible into a first group 122 that has a continuous surface and a second group 124 that has multiple, isolated, electrically conductive parts, a first plurality of solder balls or solder bumps 130 mounted on some of bonding pads 120 and in electrical and mechanical contact with the bonding pads, a second plurality of multi-terminal components 140 mounted on a second group of bonding pads 120, a second substrate 150, and a second array of bonding pads mounted on the second substrate and in electrical and mechanical contact with the solder balls or solder bumps 130.

Bonding pads are conventionally formed on a substrate such as the upper surface of an integrated circuit in a two-dimensional rectilinear array of pads. In typical patterns, the array may fill the entire surface of the substrate, or it may extend around only the periphery of the substrate leaving the central region of the substrate empty of solder balls or solder bumps, or it may have both a peripheral component and a component in the center of the peripheral region. Each pad is made of an electrically conductive material such as copper, is substantially circular in shape, is substantially flat, and is continuous (i.e., having no holes in its surface). Each pad is connected to a conductor that extends across or into the substrate; and the conductor may extend through the substrate to the other side. Such conventional pads are illustrated as pads 122 in FIG. 1B.

In accordance with the invention, bonding pads 120 are preferably formed in a two-dimensional rectilinear array, are made of an electrically conductive material such as copper and are substantially flat; but only the first group 122 of bonding pads in the first subset is similar to those of the prior art. The bonding pads in the second group 124 are formed so that each pad has a plurality of isolated electrically conductive regions that are connected to different conductors that extend across or into the substrate.

Various bonding pads having a plurality of isolated electrically conductive regions are illustrated in FIGS. 2-10. FIG. 2 is a top view of an illustrative pad 210 having two D-shaped elements 212, 214 in back-to-back relation. Illustratively, the D-shaped elements are separated by an insulating element 222 which may be simply empty space. D-shaped elements 212, 214 have conductors 232, 234, respectively, that connect the D-shaped elements to other parts of the circuit.

FIG. 3 is a top view of an illustrative pad 310 having an inner circular region 312 and an outer annular region 314. Illustratively, the regions are separated by an insulating element 322. Conductors 332, 334, connect inner region 312 and annular region 314, respectively, to other parts of the circuit.

FIG. 4 is a top view of an illustrative pad 410 having three electrically conductive regions that are isolated from one another: an inner circular region 412 and outer regions 414 and 414 on either side of the inner region. Illustratively, the regions are separated by an insulating element 422. Conductors 432, 434, and 436 connect inner region 412 and outer regions 414, 416, respectively, to other parts of the circuit.

FIG. 5 is a top view of an illustrative pad 510 having three electrically conductive regions 512, 514, 516 that are isolated from one another, each region taking up approximately one-third of a circle. Illustratively, the regions are separated by an insulating element 522. Conductors 532, 534, and 536 connect regions 512, 514, 516, respectively, to other parts of the circuit.

FIG. 6 is a top view of an illustrative pad 510 having three electrically conductive regions 612, 614, 616 that are isolated from one another, one region being a semi-circular region and the other two regions being quadrants. Illustratively, the regions are separated by an insulating element 622. Conductors 632, 634, and 636 connect regions 612, 614, 616, respectively, to other parts of the circuit.

Figure 7:
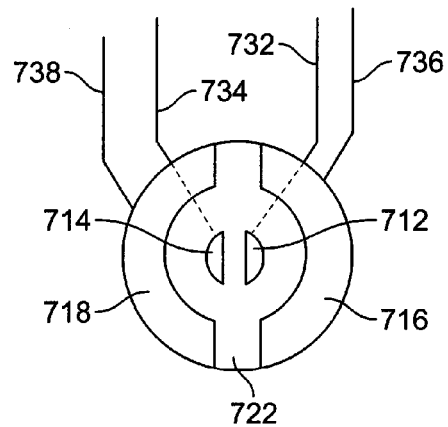
FIG. 7 is a top view of a fifth alternative detail of the embodiment of FIGS. 1A and 1B.

FIG. 7 is a top view of an illustrative pad 710 having four electrically conductive regions that are isolated from one another: two inner regions 712, 714 and two outer regions 716 and 718 on the outside of the inner regions. Illustratively, the regions are separated by an insulating element 722. Conductors 732, 734, 736 and 738 connect inner regions 712, 714 and outer regions 716, 718, respectively, to other parts of the circuit.

Figure 8:
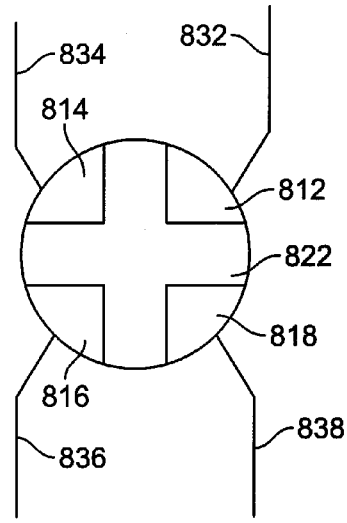
FIG. 8 is a top view of a sixth alternative detail of the embodiment of FIGS. 1A and 1B.

FIG. 8 is a top view of an illustrative pad 810 having four electrically conductive regions that are isolated from one another: two inner regions 812, 814 and two outer semi-annular regions 816 and 818 on the outside of the inner regions. Illustratively, the regions are separated by an insulating element 822. Conductors 832, 834, 836, 838 connect inner regions 812, 814 and outer regions 816, 818, respectively, to other parts of the circuit.

Figure 9:
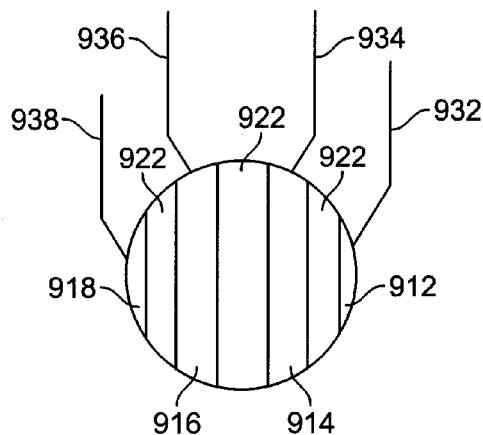
FIG. 9 is a top view of a seventh alternative detail of the embodiment of FIGS. 1A and 1B.

FIG. 9 is a top view of a pad 910 having four electrically conductive regions 912, 914, 916, 918 that are isolated from one another, each region taking up approximately one-quarter of a circle. Illustratively, the regions are separated by an insulating element 922. Conductors 932, 934, 936, 938 connect regions 912, 914, 916, 918, respectively, to other parts of the circuit.

Figure 10:
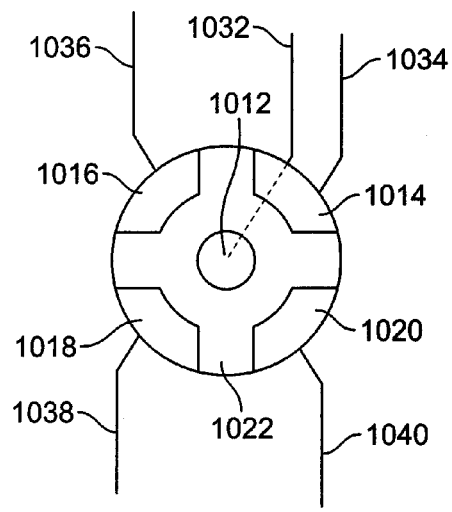
FIG. 10 is a top view of a eighth alternative detail of the embodiment of FIGS. 1A and 1B.

FIG. 10 is a top view of a pad 1010 having five electrically conductive regions 1012, 1014, 1016, 1018, 1020 that are isolated from one another: a center region 1012, and four peripheral regions 1014, 1016, 1018, 1020, each peripheral region taking up approximately one-quarter of a circle. Illustratively, the regions are separated by an insulating element 1022. Conductors 1032, 1034, 1036, 1038, 1040 connect regions 1012, 1014, 1016, 1018, 1020, respectively, to other parts of the circuit.

As indicated in FIG. 1A, solder balls or solder bumps 130 have a height H as measured between the bonding pads and the extremity of the solder ball or solder bump at its greatest distance from the substrate. In conventional manufacturing processes, considerable effort is made to ensure that the height of the solder balls or solder bumps is substantially the same for all the solder balls or solder bumps mounted on substrate 110 so that good contact is made with a substantially flat upper surface of any substrate on which the solder balls or solder bumps will eventually be mounted. Likewise, in the present invention, the height H of the solder balls or solder bumps 130 preferably is substantially the same.

Components 140 have a height h that is no more than height H as measured between the bonding pads and the extremity of the components at their greatest distance from the substrate. As a result, components 140 do not interfere with the placement of the substrate on the surface on which it is mounted. In some cases, however, it may be advantageous to use components 140 that have a height h that is substantially the same as the height H of solder balls or solder bumps 130 so that components 140 can also make electrical connection to structures such as bonding pads 130 on the mounting surface.

Components 140 may include passive electrical components including two-terminal devices such as resistors, capacitors, and inductors; three terminal devices such as "T" type and "Π" attenuators and "T" type and "Δ" combiners and splitters; and four-terminal devices such as couplers. Examples of such components are described in Sections 2.1, 2.3, 2.4, and 2.5 of G. R. Blackwell, et al., *Surface-Mount Technology for PC Boards*, pp. 32-49 and 86-90 (Thomson Delmar Learning, 2$^{nd}$ Ed., 2006), which pages are hereby incorporated by reference.

As depicted in FIGS. 2-10, such components are mounted on pads having a plurality of isolated electrically conductive regions so that each terminal of the passive component is electrically connected to a different one of the plurality of isolated electrically conductive regions of the pad.

Components 140 may also include active components such as switches, sensors, accelerometers, regulators, interlocks, diodes, transistors, integrated circuits, MEMS devices, mechanical components and the like all of which have multiple electrical leads each of which leads is electrically connected to a different one of the isolated electrically conductive regions of the pad on which it is mounted.

Examples of such components are further described in Section 2.2 of Ibid., pp. 49-53 which pages are hereby incorporated by reference.

In addition, components 140 might include warpage compensation circuits that adjust for warpage in the first and or second substrates by pulling the substrates together or pushing them apart as needed.

Figure 11:
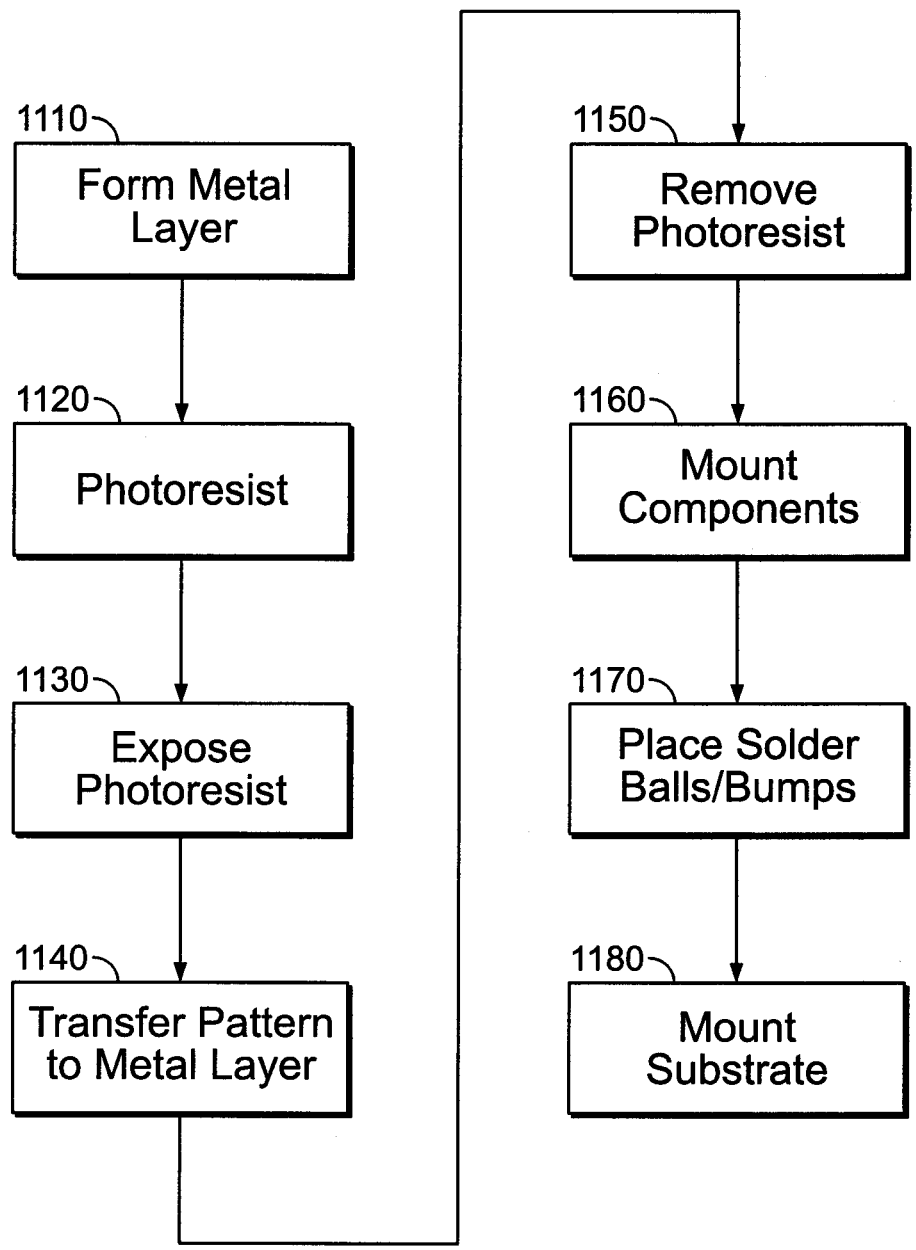
FIG. 11 is a flow chart depicting an illustrative process of the invention.

FIG. 11 is a flow chart depicting an illustrative process for making the enhanced ball grid array of FIG. 1. Bonding pads 120 are formed on substrate 110 by first forming at step 1110 a layer of metal on an upper surface of the substrate that is in contact with the metal leads that extend across or into the substrate. Following conventional photolithographic techniques, at step 1120 a layer of photoresist is then formed on the metal layer; the photoresist layer is then exposed at step 1130 to a pattern of actinic radiation that defines the desired shapes of the bonding pads; at step 1140, the metal layer is then shaped in accordance with this pattern to define the shapes of the bonding pads; and at step 1150 the remaining photoresist is removed, leaving individual bonding pads including both conventional circular bonding pads and bonding pads having multiple isolated electrically conductive regions. Advantageously, both the conventional bonding pads and the bonding pads having multiple isolated electrically conductive regions can be formed simultaneously simply be exposing the photoresist to actinic radiation having the desired pattern needed to form the pads. Components 140 are then placed at step 1160 on the appropriate bonding pads having multiple electrically isolated regions; and at step 1170 the solder balls aor solder bumps are placed on the conventional bonding pads. Substrate 110 may then be mounted on substrate 150 as shown in FIG. 1A.

As will be apparent to those skilled in the art, numerous variations may be practiced within the spirit and scope of the present invention.

What is claimed is:

1. A device package comprising:
   a substrate having first and second major surfaces and electrical conductors extending across or into the substrate;
   a two-dimensional array of pads formed on the first major surface of the substrate, first and second subsets of the pads being connected to the electrical conductors, each pad of the second subset of the pads having a plurality of isolated electrically conductive regions that are connected to different conductors;
   solder balls or solder bumps formed on the first subset of the pads, said solder balls or solder bumps having a first height; and
   other devices formed on the second subset of the pads that have a height that is no more than that of the first height, wherein each of the other devices is directly mounted on one of the second subset of the pads, wherein each of the other devices comprises multiple terminals, and wherein each of the multiple terminals of one of the other devices is electrically connected to a different one of the plurality of isolated electrically conductive regions of one of the second subset of the pads.

2. The package of claim 1 wherein the other devices include devices having two electrical terminals and the two terminals are connected to two isolated electrically conductive regions in certain of the pads of the second subset of pads.

3. The package of claim 1 wherein the other devices are selected from the group consisting of resistors, capacitors, and inductors.

4. The device of claim 1 wherein the other devices include devices having three electrical terminals and the three terminals are connected to three isolated electrically conductive regions in certain of the pads of the second subset of pads.

5. The package of claim 1 wherein the other devices include devices having four electrical terminals and the four terminals are connected to four isolated electrically conductive regions in certain of the pads of the second subset of pads.

6. The package of claim 1 wherein the other devices are selected from the group of active devices consisting of switches, sensors, accelerometers, regulators, interlocks, diodes, transistors, integrated circuits, MEMS devices, mechanical components, and warpage compensation circuits.

7. A device structure comprising:
   a first substrate having first and second major surfaces and electrical conductors extending across or into the substrate;
   a two-dimensional array of pads formed on the first major surface of the first substrate, first and second subsets of the pads being connected to the electrical conductors, each pad of the second subset of the pads having a plurality of isolated electrically conductive regions that are connected to different conductors;
   solder balls or solder bumps formed on the first subset of the pads, said solder balls or solder bumps having a first height;
   other devices formed on the second subset of the pads that have a height that is no more than the first height, wherein each of the other devices is directly mounted on one of the second subset of the pads, wherein each of the other devices comprises multiple terminals, and wherein each of the multiple terminals of each of the other devices is electrically connected to a different one of the plurality of isolated electrically conductive regions of a corresponding one of the second subset of the pads;
   a second substrate having first and second major surfaces; and
   electrical conductors formed on the first major surface of the second substrate and in contact with the solder balls or solder bumps formed on the first set of pads on the first substrate.

8. The device structure of claim 7 wherein the other devices include devices having two electrical terminals and the two terminals are connected to two isolated electrically conductive regions in certain of the pads of the second subset of pads.

9. The device structure of claim 7 wherein the other devices are selected from the group consisting of resistors, capacitors and inductors.

10. The device structure of claim 7 wherein the other devices include devices having three electrical terminals and the three terminals are connected to three isolated electrically conductive regions in certain of the pads of the second subset of pads.

11. The device structure of claim 7 wherein the other devices include devices having four electrical terminals and the four terminals are connected to four isolated electrically conductive regions in certain of the pads of the second subset of pads.

12. The device structure of claim 7 wherein the other devices are selected from the group of active devices consisting of switches, sensors, accelerometers, regulators, interlocks, diodes, transistors, integrated circuits, MEMS devices, mechanical components, and warpage compensation circuits.

13. A ball grid array comprising:
a two-dimensional array of pads formed on a first major surface of a substrate, first and second subsets of the pads being connected to conductors that extend across or into the substrate, each pad of the second subset of the pads having a plurality of isolated electrically conductive regions that are connected to different conductors;
solder balls or solder bumps formed on the first subset of the pads, said solder balls or solder bumps having a first height; and
other devices formed on the second subset of the pads that have a height that is no more than the first height, wherein each of the other devices is directly mounted on one of the second subset of the pads, wherein each of the other devices comprises multiple terminals, and wherein each of the multiple terminals of one of the other devices is electrically connected to a different one of the plurality of isolated electrically conductive regions of one of the second subset of the pads.

14. The ball grid array of claim 13 wherein the other devices include devices having two electrical terminals and the two terminals are connected to two isolated electrically conductive regions in certain of the pads of the second subset of pads.

15. The ball grid array of claim 13 wherein the other devices are selected from the group consisting of resistors, capacitors and inductors.

16. The ball grid array of claim 13 wherein the other devices include devices having three electrical terminals and the three terminals are connected to three isolated electrically conductive regions in certain of the pads of the second subset of pads.

17. The ball grid array of claim 13 wherein the other devices include devices having four electrical terminals and the four terminals are connected to four isolated electrically conductive regions in certain of the pads of the second subset of pads.

18. The ball grid array of claim 13 wherein the other devices are selected from the group of active devices consisting of switches, sensors, accelerometers, regulators, interlocks, diodes, transistors, integrated circuits, MEMS devices, mechanical components, and warpage compensation circuits.

19. A method for forming a ball grid array comprising:
forming an array of bonding pads on a first major surface of a first substrate, a first group of the bonding pads each having a continuous electrically conductive surface and a second group of the bonding pads each having multiple electrically conductive elements separated from one another, wherein the first and second groups of the bonding pads are connected to conductors that extend across or into the first substrate;
mounting multi-terminal components directly on the bonding pads of the second group of bonding pads, wherein each of multiple terminals of one of the multi-terminal components is electrically connected to a different one of the electrically conductive elements of one of the bonding pads in the second group of the bonding pads; and
mounting solder balls or solder bumps on bonding pads in the first group of the bonding pads, wherein the multi-terminal components have a height that is no more than the height of the solder balls.

20. The method of claim 19 further comprising mounting the first substrate, the solder balls or solder bumps and the multi-terminal components on a second substrate.

21. The method of claim 19 wherein the first and second groups of bonding pads are formed simultaneously.

22. A device structure comprising:
a first substrate having first and second major surfaces and electrical conductors extending across or into the substrate;
an array of pads formed on the first major surface of the first substrate, at least some of said pads being connected to the electrical conductors, a first subset of pads comprising pads that are connected to a single electrical conductor each and a second subset of pads comprising pads having a plurality of isolated electrically conductive regions each of which is connected to a different electrical conductor;
solder balls or solder bumps formed on the first subset of pads, said solder balls or solder bumps having a first height;
other devices formed on the second subset of pads that have a height that is no more than the first height, wherein each of the other devices is directly mounted on one of the second subset of pads, wherein each of the other devices comprises multiple terminals, and wherein each of the multiple terminals of one of the other devices is electrically connected to a different one of the plurality of isolated electrically conductive regions of one of the second subset of pads;
a second substrate having first and second major surfaces; and
electrical conductors formed on the first major surface of the second substrate and in contact with the solder balls or solder bumps formed on the first subset of pads on the first substrate.

23. The device structure of claim 22 wherein the other devices include devices having four electrical terminals and the four terminals are connected to four isolated electrically conductive regions in certain of the pads of the second subset of pads.

24. A device structure comprising:
an array of pads formed on a first major surface of a first substrate, the pads being connected to electrical conductors that extend across or into the first substrate, a first subset of pads comprising pads that are connected to a single electrical conductor each and a second subset of pads comprising pads having a plurality of isolated electrically conductive regions each of which is connected to a different electrical conductor;
solder balls or solder bumps formed on the first subset of pads, said solder balls or solder bumps having a first height;
other devices formed on the second subset of pads that have a height that is no more than the first height, wherein each of the other devices is directly mounted on one of the second subset of pads, wherein each of the other devices comprises multiple terminals, and wherein each of the multiple terminals of each of the other devices is electrically connected to a different one of the plurality of isolated electrically conductive regions of a corresponding one of the second subset of pads;
a second substrate having first and second major surfaces; and
electrical conductors formed on the first major surface of the second substrate and in contact with the solder balls or solder bumps formed on the first subset of pads.

25. The device structure of claim 24 wherein the other devices include devices having four electrical terminals and the four terminals are connected to four isolated electrically conductive regions in certain of the pads of the second subset of pads.

* * * * *